United States Patent [19]

Nguyen et al.

[11] Patent Number: 5,065,054
[45] Date of Patent: Nov. 12, 1991

[54] INPUT BUFFER WITH NOISE FILTER FOR ELIMINATING SHORT-PULSE-WIDTH NOISE

[75] Inventors: Liem T. Nguyen; Hans Magnusson, both of Austin, Tex.

[73] Assignee: Advanced Micro Devices, Inc., Sunnyvale, Calif.

[21] Appl. No.: 606,882

[22] Filed: Nov. 21, 1990

[51] Int. Cl.$^5$ .......................... H03K 5/00; H03K 5/22
[52] U.S. Cl. .................................. 307/520; 307/542.1; 307/234; 307/290; 328/111
[58] Field of Search ............... 307/520, 443, 234, 290, 307/263, 542, 542.1; 328/111, 112

[56] References Cited

U.S. PATENT DOCUMENTS

| | | | |
|---|---|---|---|
| 4,497,068 | 1/1985 | Fischer | 328/111 |
| 4,719,367 | 1/1988 | Denda | 307/290 |
| 4,775,840 | 10/1988 | Ohmori et al. | 307/234 |
| 4,857,760 | 8/1989 | Stuebing | 307/234 |
| 4,945,261 | 7/1990 | Wright | 307/443 |
| 5,001,374 | 3/1991 | Chang | 307/520 |

Primary Examiner—Stanley D. Miller
Assistant Examiner—Toan Tran
Attorney, Agent, or Firm—Foley & Lardner

[57] ABSTRACT

An input buffer provides buffering of digital input signals and noise filtering. The input buffer includes a Schmitt trigger having a fast response to digital signal rising edges and a slow response to digital signal falling edges. A first transfer gate having a relatively slow response conveys rising edge transitions to the Schmitt trigger and a second transfer gate having a relatively fast response conveys falling edge transitions to the Schmitt trigger.

20 Claims, 1 Drawing Sheet

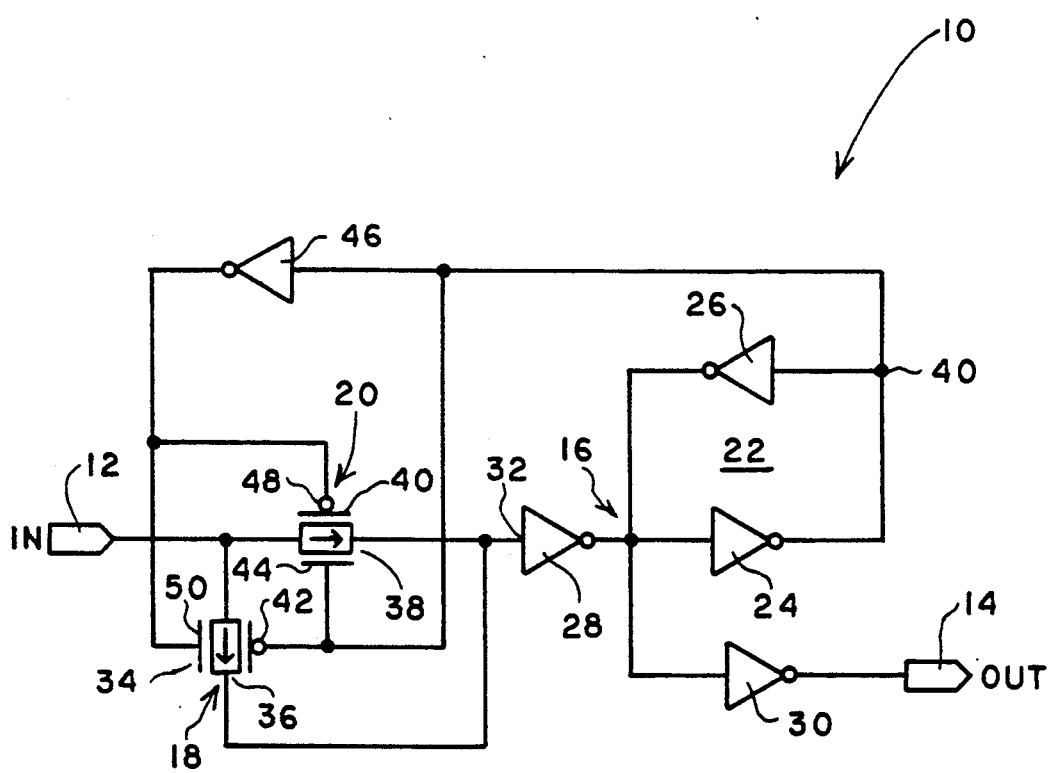

INPUT BUFFER WITH NOISE FILTER FOR ELIMINATING SHORT-PULSE-WIDTH NOISE

BACKGROUND OF THE INVENTION

The present invention relates generally to an input buffer for use in an integrated circuit. The present invention more particularly relates to such an input buffer which buffers input digital signals and filters noise.

Integrated circuits are well known in the art. Some integrated circuits are intended for use in digital processing systems in association with other devices external to the digital processing integrated circuit. In many instances, the devices external to the digital integrated circuits generate spurious or noise signals, which, if not filtered, would provide false inputs to the digital integrated circuit.

As a result, input buffering is preferable in digital integrated circuits. Such input buffering assures that valid logic one or logic zero inputs are properly interpreted and filter spurious signals or noise which are generally either shorter in duration than valid logic levels or of lesser magnitude than valid logic levels.

Input buffers have taken different forms. One known input buffer includes a chain of buffering inverters coupled to one or more AND gates. The inverters buffer the input signals to appropriate signal levels and the AND gates differentiate the valid input transitions from noise. Unfortunately, such input buffers impose gate delays and reduce the operating speed of the integrated circuits in which they are employed. In addition, such input buffers require many active devices which occupy considerable integrated circuit surface area to achieve a filtering function.

There is therefore a need in the art for a new and improved input buffer which provides both input buffering and noise filtering. The present invention provides such an improved input buffer which both buffers digital input signals and which filters noise without requiring a large number of active devices on the integrated circuit on which it is employed.

SUMMARY OF THE INVENTION

The present invention provides an input buffer for buffering digital input signals having first and second voltage levels and filtering noise signals of short duration. The input buffer includes an input adapted to receive the digital input signals, an output, and threshold circuit means coupled to the output and having an input. The threshold circuit means is arranged for providing the output with the first voltage level responsive to an input signal being below a threshold voltage and is arranged for providing the output with a second voltage level responsive to an input signal being above the threshold voltage. The threshold voltage is closer in potential to one of the voltage levels than the other voltage level. The input buffer further includes first transfer means coupled between the input buffer input and the threshold circuit means input for conveying, to the threshold circuit means, input signals which are in transition from the one voltage level to the other voltage level. The first transfer means is arranged to have a slow response to transitions from the one voltage level to the other voltage level. The input buffer further includes second transfer means coupled between the input buffer input and the threshold circuit means input for conveying, to the threshold circuit means, input signals which are in transition from the other voltage level to the one voltage level. The second transfer means is arranged to have a fast response to transitions from the other voltage level to the one voltage level.

The present invention further provides an input buffer for providing buffered digital signals in response to input signals and for filtering noise. The input buffer includes an input adapted to receive the digital input signals, wherein the digital input signals have rising and falling edges, an output, and a Schmitt trigger coupled to the output for providing the buffered digital signals. The Schmitt trigger has an input and is arranged to provide a fast response to digital signal rising edges and a slow response to digital signal falling edges. The input buffer further includes first transfer means coupled between the input buffer input and the Schmitt trigger input to convey the rising edges of the input digital signals to the Schmitt trigger and is arranged to have a slow response to the input digital signal rising edges. The input buffer further includes second transfer means coupled between the input buffer input and the Schmitt trigger input to convey the falling edges of the input digital signals to the Schmitt trigger and is arranged to have a fast response to the digital signal falling edges.

BRIEF DESCRIPTION OF THE DRAWING

The features of the present invention which are believed to be novel are set forth with particularity in the appended claims. The invention, together with further objects and advantages thereof, may best be understood by making reference to the following description taken in conjunction with the accompanying drawing, in the sole Figure of which like reference characters identify identical elements, and wherein the sole figure is a schematic circuit diagram of an input buffer embodying the present invention.

DETAILED DESCRIPTION OF THE PREFERRED EMBODIMENT

Referring now to the sole Figure, it illustrates an input buffer 10 embodying the present invention. The input buffer 10 generally includes an input 12, an output 14, a threshold circuit means 16, a first transfer means or gate 18, and a second transfer means or gate 20. The input buffer 10 is arranged to receive at its input 12 digital input signals which, during steady state conditions, have a first voltage level of, for example, zero volts, and a second voltage level of, for example, five volts. The threshold circuit 16 provides at the output 14 of the input buffer 10 corresponding first and second voltage levels in response to the voltage levels at input 12.

The threshold circuit 16 includes a Schmitt trigger 22 which includes a first inverter 24, a second inverter 26, and a third inverter 28. The first and second inverters 24 and 26 are reversed coupled and the third inverter is coupled in series with the reversed coupled inverters 24 and 26 as illustrated. A fourth inverter 30 of the threshold circuit 16 couples the Schmitt trigger 22 to the output 14 of the input buffer 10.

The Schmitt trigger 22 establishes a threshold voltage at the input 32 of inverter 28 of approximately 1.5 volts. As will be seen hereinafter, when the voltage at the input 32 of inverter 28 is below the threshold voltage, the input buffer will provide at output 14 the first voltage level of zero volts and when the voltage at input 32 of inverter 28 is above the threshold voltage, the input buffer 10 will provide at output 14 the second voltage level of five volts. Because the threshold voltage of the Schmitt trigger is closer to the first voltage level of zero volts than the second voltage level of five volts, the Schmitt trigger is arranged to have a fast response to the rising edges of digital input signals received at input 32 of inverter 28 and a comparatively slow response to the falling edges of the digital input signals received at the input 32 of inverter 28.

The first and second transfer gates 18 and 20 are coupled between the input 12 of the input buffer 10 and the input 32 of inverter 28. The first transfer gate 18 is formed by a first field-effect transistor 34 which is coupled in parallel with a second field-effect transistor 36. The first field-effect transistor 34 is an N-Channel field-effect transistor and the second field-effect transistor 36 is a P-Channel field-effect transistor. The sources of the field-effect transistors 34 and 36 are coupled together and to the input 12 of the input buffer 10. The drains of the field-effect transistors 34 and 36 are also coupled together and to the input 32 of inverter 28.

Similarly, the second transfer gate 20 is formed by a first field-effect transistor 38 coupled in parallel with a second field-effect transistor 40. The first field-effect transistor 38 is an N-Channel field-effect transistor and the second field-effect transistor 40 is a P-Channel field-effect transistor. The sources of the field-effect transistors 38 and 40 are coupled together and to the input 12 of the input buffer 10, the drains of the field-effect transistors 38 and 40 are also coupled together and to the input 32 of inverter 28.

As will be seen hereinafter, the first transfer gate 18 transfers the rising edges of the digital input signals received at input 12 to the Schmitt trigger 22 and the second transfer gate 20 conveys the falling edges of the digital input signals received at input 12 to the Schmitt trigger 22 at the input 32 of inverter 28. To enable the transfer gates 18 and 20 to convey the rising and falling edges respectively, the first and second transfer gates 18 and 20 are enabled by the Schmitt trigger 22. To that end, the common junction 40 of inverters 24 and 26 of the Schmitt trigger 22 is coupled directly to the gate 42 of field-effect transistor 36 and the gate 44 of the field-effect transistor 38. The common junction 40 is also coupled through an inverter 46 to the gate 48 of field-effect transistor 40 and to the gate 50 of field-effect transistor 34. The gate 42 of field-effect transistor 36 forms a first enable input of the first transfer gate 18 and the gate 48 of field-effect transistor 40 forms a second enable input of the second transfer gate 20.

The first and second transfer gates 18 and 20 are enabled in response to receiving at the first and second enable inputs 42 and 48 respectively a low logic level from the Schmitt trigger 22. To that end, when the output 14 is at a low logic level, the Schmitt trigger 22 will provide a low logic level to the first enable input 42 to enable the first transfer gate 18 to convey the next rising edge of the input signal at input 12 to the input 32 of inverter 28. When the output 14 is at the high logic level, the Schmitt trigger 22 will provide through inverter 46 a low logic level to the enable input 48 to enable the second transfer gate to convey the next falling edge of the input signal at input 12 to the input 32 of inverter 28.

In accordance with the present invention, the first transfer gate 18 is arranged to have a slow response to the rising edges received at the input 12. Such a slow response may be obtained, as well known in the art, by configuring the channels of the field-effect transistors 34 and 36 to impose a high resistance and high capacitance to the input signals received at the sources of the field-effect transistors 34 and 36.

Also in accordance with the present invention, the second transfer gate 20 is arranged to have a fast response to the falling edges of the input signals received at the input 12 of the input buffer 10. Such a fast response may be obtained, in a manner well known in the art, by configuring the channels of the field-effect transistors 38 and 40 to impose a relatively small resistance and capacitance to the falling edges of the input signals received at the sources of the field-effect transistors 38 and 40.

The slow response of the first transfer gate 18 is provided because the Schmitt trigger 22 has a relatively fast response to rising edges received at the input 32 of inverter 28 resulting from the threshold voltage being closer to the first voltage level of zero volts than the second voltage level of five volts. The fast response of the second transfer gate 20 is provided because the Schmitt trigger 22 has a relatively slow response to falling edges received at the input 32 of inverter 28 due to the threshold voltage being further in potential from the second voltage level of five volts than the first voltage level of zero volts. As a result, characteristics with respect to the input signals received at input 12 to compensate for the asymmetrical characteristics of the Schmitt trigger 22. As will be seen hereinafter, the asymmetrical characteristics of the first and second transfer gates 18 and 20 enable the Schmitt trigger 22 to discriminate noise from valid input signal transitions without imposing excessive gate delays characteristic of prior art input buffers. As a result, the input buffer 10 embodying the present invention is capable of operating at higher speeds than prior art input buffers while still providing the important function of noise filtering.

In operation, when the input signal at input 12 is at a steady state low logic level, the output 14 will also provide a low logic level. The common junction 40 of the Schmitt trigger 22 will also be at a low logic level which is impressed upon the enable input 42 of the first transfer gate 18 to enable the first transfer gate 18 to convey the next rising edge of the digital input at input 12.

When the input 12 is at a high logic level the output 14 will also be at a high logic level. The common junction 40 will be at a high logic level which is inverted by the inverter 46 so that the second enable input 48 will receive a low logic level to enable the second transfer gate 20 to convey the next falling edge of the digital input signal at input 12.

When the input signal at input 12 rises from a low logic level, it is conveyed through the first transfer gate 18 to the Schmitt trigger 22 at input 32 of inverter 28. Because the first transfer gate 18 has a slow response to input rising edges, the first transfer gate 18 slows down the transition seen at the input 32 of inverter 28. If the rise in the input voltage is due to noise, it will fall back to zero before the input voltage exceeds the threshold of the Schmitt trigger 22. However, if the rising edge at input 12 is a lid transition, the rising voltage at input 12 will continue to rise above the threshold voltage at input 32 of inverter 28 of the Schmitt trigger 22 to cause the Schmitt trigger to change state to cause the voltage at output 14 to go from a low logic level to a high logic level. This will cause the first transfer gate 18 to be disabled and the second transfer gate 20 to be enabled to convey the next falling edge of the input signal at input 12. Hence, the delay in the first transfer gate 18 compensates for the fast response of the Schmitt trigger to rising edges at the input 32 of inverter 28.

When the signal on input 12 falls from the high logic level, the falling edge propagates through the second transfer gate 20 to the Schmitt trigger. Because the second transfer gate 20 has a fast response to input falling edges, the falling edge will be propagated to the Schmitt trigger 22 at input 32 of inverter 28 without any delay. Since the threshold voltage of the Schmitt trigger is further from the high voltage level that the low voltage level, it will respond slowly to a falling input signal. Hence, if the falling input signal is due to noise, it will return to the high voltage level without going below the threshold voltage of the Schmitt trigger 22. However, if the falling voltage at the input 12 is a valid falling edge, the input signal will continue to fall to below the threshold voltage of the Schmitt trigger 22 at input 32 of inverter 28 to cause the Schmitt trigger 22 to change state to provide a transition at output 14 from the high voltage level to the low voltage level. This causes the second transfer gate 20 to then be disabled and the first transfer gate 18 to once again be enabled for conveying the next rising edge of the input signal at input 12.

As can be seen from the foregoing, the present invention provides a new and improved input buffer with noise filtering. Because the first transfer gate has a slow response, rising transitions due to noise may be filtered even though the Schmitt trigger has a fast response to rising edges. Conversely, the second transfer gate 20 has a fast response due to the relatively slow response of the Schmitt trigger 22 to falling edges. As a result, falling input signals due to noise may also be filtered allowing only valid falling edge transitions to effect the output of the buffer. As a result, noise filtering is achieved within the input buffer without resulting to inverter chains and AND gates which in the past have imposed gate delays. Also, as a result, the input buffer of the present invention is capable of filtering noise while responding to valid transitions in the digital input signal without adversely affecting operating speed.

While a particular embodiment of the present invention has been shown and described, modification may be made, and it is therefore intended to cover in the appended claims all such changes and modifications which fall within the true spirit and scope of the invention.

What is claimed is:

1. An input buffer for buffering digital input signals having first and second voltage levels and filtering noise signals of short duration, said input buffer comprising:
   an input adapted to receive said digital input signals;
   an output;
   threshold circuit means coupled to said output and having an input, said threshold circuit means being arranged for providing said outlet with said first voltage level responsive to an input signal being below a threshold voltage and being arranged for providing said output with said second voltage level responsive to an input signal being above said threshold voltage, said threshold voltage being closer in potential to one of said voltage levels than the other said voltage levels;
   first transfer means coupled between said input buffer input and said threshold circuit means input for conveying, to said threshold circuit means, input signals which are in transition from said one voltage level to said other voltage level, said first transfer means be arranged to have a slow response; and
   second transfer means coupled between said input buffer input and said threshold circuit means input for conveying, to said threshold circuit means, input signals which are in transition from said other voltage level to said one voltage level, said second transfer means having a first response.

2. An input buffer as defined in claim 1 wherein said threshold circuit means comprises a Schmitt trigger.

3. An input buffer as defined in claim 2 wherein said Schmitt trigger comprises first and second reverse coupled inverters and a third inverter coupled in series with said reverse coupled inverters, said third inverter having an input coupled to said first and second transfer means.

4. An input buffer as defined in claim 3 wherein said threshold circuit means further includes a fourth inverter coupling said Schmitt trigger to said output.

5. An input buffer as defined in claim 2 wherein said first transfer means comprises a first transfer gate.

6. An input buffer as defined in claim 5 wherein said second transfer means comprises a second transfer gate.

7. An input buffer as defined in claim 6 wherein said first transfer gate includes a first enable input and wherein said Schmitt trigger is coupled to said first enable input for enabling said first transfer gate when said output is providing said one voltage level.

8. An input buffer as defined in claim 7 wherein said second transfer gate includes a second enable input and wherein said Schmitt trigger is coupled to said second enable input for enabling said second transfer gate when said output is providing said other voltage level.

9. An input as defined in claim 8 wherein said one voltage level is said first voltage level and wherein said other voltage level is said second voltage level.

10. An input buffer as defined in claim 9 wherein said first voltage level is approximately zero volts, wherein said second voltage level is approximately five volts, and wherein said threshold voltage is approximately 1.5 volts.

11. An input buffer as defined in claim 9 further including an inverter coupling said Schmitt trigger to said second enable input.

12. An input buffer as defined in claim 6 wherein said first and second transfer gates each comprise first and second parallel coupled field-effect transistors.

13. An input buffer for providing buffered digital signals in response to digital input signals and for filtering noise, said input buffer comprising:
   an input adapted to receive said digital input signals, said digital input signals having rising and falling edges;
   an output;
   a Schmitt trigger coupled to said output for providing said buffered digital signals, said Schmitt trigger having an input and being arranged to provide a fast response to digital signal rising edges and a slow response to digital signal falling edges;
   first transfer means coupled between said input buffer input and said Schmitt trigger input, said first transfer means being arranged to convey the rising edges of said input digital signals to said Schmitt trigger and having a slow response to said input digital signal rising edge; and
   second transfer means coupled between said input buffer input and said Schmitt trigger input, said second transfer means being arranged to convey the falling edges of said input digital signals to said Schmitt trigger and having a fast response to said digital signal falling edges.

14. An input buffer as defined in claim 13 wherein said Schmitt trigger comprises first and second reverse coupled inverters and a third inverter coupled in series with said reverse coupled inverters, said third inverter having an input coupled to said first and second transfer means.

15. An input buffer as defined in claim 13 further including an inverter coupling said Schmitt trigger to said output.

16. An input buffer as defined in claim 13 wherein said first transfer means comprises a first transfer gate.

17. An input buffer as defined in claim 16 wherein said second transfer means comprises a second transfer gate.

18. An input buffer as defined in claim 17 wherein said first transfer gate includes a first enable input and wherein said Schmitt trigger is coupled to said first enable input for enabling said first transfer gate to convey said rising edges of said input digital signals.

19. An input buffer as defined in claim 18 wherein said second transfer gate includes a second enable input and wherein said Schmitt trigger is coupled to said second enable input for enabling said second transfer gate to convey said falling edges of said input digital signals.

20. An input buffer as defined in claim 19 further including an inverter coupling said Schmitt trigger to said second enable input.

* * * * *